(12) United States Patent
Liu et al.

(10) Patent No.: US 7,335,924 B2
(45) Date of Patent: Feb. 26, 2008

(54) HIGH-BRIGHTNESS LIGHT EMITTING DIODE HAVING REFLECTIVE LAYER

(75) Inventors: Jin-Hsiang Liu, Taipei (TW);
Hui-Heng Wang, Taoyuan (TW);
Kun-Chuan Lin, Taipei (TW)

(73) Assignee: Visual Photonics Epitaxy Co., Ltd., Taoyuan (TW)

( * ) Notice: Subject to any disclaimer, the term of this patent is extended or adjusted under 35 U.S.C. 154(b) by 0 days.

(21) Appl. No.: 11/180,013

(22) Filed: Jul. 12, 2005

(65) Prior Publication Data

US 2007/0012937 A1   Jan. 18, 2007

(51) Int. Cl.
*H01L 29/22* (2006.01)
(52) U.S. Cl. .............. 257/98; 257/91; 257/99; 257/103; 257/744; 257/745; 257/E33.063; 257/E33.064; 257/E33.068
(58) Field of Classification Search .............. 257/98, 257/99, E33.064, E33.068, E33.069, E33.072, 257/79, 94, 102, E33.026, 91, 103, 744, 745, 257/E33.063
See application file for complete search history.

(56) References Cited

U.S. PATENT DOCUMENTS

| 4,570,172 | A |  | 2/1986 | Henry et al. | 357/17 |
|---|---|---|---|---|---|
| 5,237,581 | A |  | 8/1993 | Asada et al. | 372/45 |
| 5,300,788 | A | * | 4/1994 | Fan et al. | 257/13 |
| 5,376,580 | A |  | 12/1994 | Kish et al. | 437/127 |
| 6,709,883 | B2 | * | 3/2004 | Yang et al. | 438/47 |
| 6,797,987 | B2 | * | 9/2004 | Chen | 257/98 |
| 6,998,642 | B2 | * | 2/2006 | Lin et al. | 257/79 |
| 2002/0105003 | A1 | * | 8/2002 | Yang et al. | 257/94 |
| 2003/0164503 | A1 | * | 9/2003 | Chen | 257/79 |
| 2005/0062049 | A1 | * | 3/2005 | Lin et al. | 257/79 |

OTHER PUBLICATIONS

"AlGaInP light-emitting diodes with mirror substrates fabricated by wafer bonding", Applied Physics Letters, Nov. 15, 1999, vol. 75, Issue 20, pp. 3054-3056.

* cited by examiner

*Primary Examiner*—Minhloan Tran
*Assistant Examiner*—Benjamin Tzu-Hung Liu

(57) ABSTRACT

An LED structure is disclosed herein, which comprises, sequentially arranged in the following order, a light generating structure, a non-alloy ohmic contact layer, a metallic layer, and a substrate. As a reflecting mirror, the metallic layer is made of a pure metal or a metal nitride for achieving superior reflectivity. The non-alloy ohmic contact layer is interposed between the metallic layer and the light generating structure so as to achieve the required ohmic contact. To prevent the metallic layer from intermixing with the non-alloy ohmic contact layer and to maintain the flatness of the reflective surface of the first metallic layer, an optional dielectric layer is interposed between the metallic layer and the non-alloy ohmic contact layer.

20 Claims, 17 Drawing Sheets

HIGH-BRIGHTNESS LIGHT EMITTING DIODE HAVING REFLECTIVE LAYER

BACKGROUND OF THE INVENTION

1. Field of the Invention

The present invention generally relates to light emitting diodes, and more particularly to a light emitting diode having a reflective layer to avoid light absorption by the diode's substrate.

2. The Prior Arts

FIG. 1a is a schematic sectional view showing a typical structure of a conventional light emitting diode (LED). As illustrated, the LED 100 contains a semiconductor substrate 103 and a light generating structure 102 on top of the substrate 103, and two ohmic contact electrodes 109 and 101 formed on the other side of the substrate 103 and on top of the light generating structure 102 respectively.

The light generating structure 102 is often made of layers of aluminum-bearing III-V compound semiconductors, such as AlGaAs for infrared and red lights, AlGaInP for yellow-green, yellow, amber, and red lights. The substrate 103 is usually made of gallium arsenide (GaAs) which has a matching lattice constant to that of the light generating structure 102. Lights generated by the light generating structure 102 are emitted toward all directions (i.e., isotropic). However, as the GaAs substrate 103 has an energy gap smaller than that of the visible light, a significant portion of the lights emitted by the light generating structure 102 is absorbed by the GaAs substrate 103, which significantly affects the LED 100's external quantum efficiency and, thereby, the LED 100's brightness.

FIG. 1b is a schematic sectional view showing another typical structure of a conventional LED. As illustrated, the LED 100' requires etching part of the light generating structure 102' so as to have the electrode 109' configured on the same side of the LED 100' as the electrode 101'. In addition, for the LED 100 of FIG. 1a, the substrate 103 has to be electrically conductive for the conduction of injection current between the electrodes 101 and 109, while, for the LED 100' of FIG. 1b, the substrate 103' could be electrically conductive or non-electrically conductive. Similar to the LED 100, the LED 100' still suffers the same substrate absorption problem. For ease of reference, the LED 100 of FIG. 1a is referred to as having a vertical electrode arrangement, while the LED 100' of FIG. 1b is referred to as having a planar electrode arrangement hereinafter.

Various approaches have been proposed to counter the problem of light absorption by the substrate. U.S. Pat. Nos. 4,570,172 and 5,237,581 disclose a similar light emitting diode structure as depicted in FIG. 1 except that, on top of the substrate, the light generating structure is sandwiched between a lower and an upper Distributed Bragg Reflectors (DBRs). By the configuration of the DBRs, lights emitted from the light generating structure toward the substrate are reflected and their absorption by the substrate is thereby avoided. However, the DBRs provide high reflectivity only for normal incident lights and the reflectivity decreases as the lights' incident angle increases. The improvement to the LED's external quantum efficiency and brightness is therefore limited.

U.S. Pat. No. 5,376,580 discloses another two approaches using wafer bonding processes. In one of the approaches, an LED epitaxial structure is first grown on a GaAs substrate. The LED epitaxial structure is then wafer-bonded to a transparent substrate. In the other approach, similarly, an LED epitaxial structure is first grown on a GaAs substrate. The LED epitaxial structure is then wafer-bonded to a mirror. Both approaches improves the LED's external quantum efficiency by removing the light-absorbing GaAs substrate, and letting lights either penetrate through the transparent substrate in the first approach or reflected by the mirror in the second approach. However, the problem with the approach using transparent substrate is that its wafer-bonding process requires to be operated under a high annealing temperature over an extended period of time, which would cause redistribution of doping profile and degrade the LED's performance. The problem with the approach using mirror is that the mirror's reflective surface is directly involved in the bonding interface during the wafer-bonding process, which would lead to roughness of the reflective surface or reactions and contaminations to the mirror's reflective surface.

Horng et al. discloses yet another technique in "AlGaInP light-emitting diodes with mirror substrates fabricated by wafer bonding", Applied Physics Letters, Nov. 15, 1999, Volume 75, Issue 20, pp. 3054-3056. In this technique, a Si substrate with an Au/AuBe reflector is fused to an LED epitaxial structure before removing the GaAs absorbing substrate. In general, Au/AuBe is used in AlGaInP LEDs to form ohmic contacts with p-type material. Here the Au/AuBe was used as a bonding layer and metal mirror in the wafer-bonded LED epitaxial structure. However, alloy material AuBe possesses inferior reflectivity and thereby limits the brightness improvement of the LED. The alloy process, which usually requires a high annealing temperature, would also compromise the surface flatness of the reflective mirror and degrade its reflectivity.

U.S. Pat. No. 6,797,987 discloses a light emitting diode also using reflective metal layer. The disclosed structure, in order to prevent the reflective metal layer from reacting with the light generating structure during the wafer bonding process, a transparent electrically conductive oxide layer such as ITO is interposed therebetween. To improve the ohmic contact between the ITO layer and the light generating structure, the disclosed structure proposes forming ohmic contact grid pattern or channels in the ITO layer, or forming an alloy metal mesh between the ITO layer and the light generating structure. The disclosed structure has rather complicated fabrication process, and therefore a high production cost. The alloy metal mesh requires a high temperature alloy process, and etching the alloy metal to form mesh is also very difficult to control. In addition, the thickness of the alloy metal requires special attention. If the alloy metal is too thin, the ohmic contact between the alloy metal and the light generating structure is inferior; if the alloy metal is too thick, the wafer bonding process couldn't achieve a strong bonding.

SUMMARY OF THE INVENTION

The major objective of the present invention therefore is to provide a high brightness LED structure which obviates the foregoing shortcomings in resolving the substrate absorption problem.

The LED structure according to the present invention comprises a light generating structure and, on a side of the light generating structure and sequentially arranged in the following order, a non-alloy ohmic contact layer, a first metallic layer, and a substrate. The foregoing LED structure, after its formation, is then put through a chip process which involves forming the electrodes and other relevant tasks in order to package the LED structure into an LED chip.

The substrate could be either electrically conductive or non-electrically conductive. If non-electrically conductive substrate is used, the electrodes formed in the subsequent chip process have to be arranged in a planar fashion. If electrically conductive substrate is used, the electrodes could be arranged in a vertical or planar fashion. For planar electrode arrangement, the LED structure could have an optional insulating layer positioned between the substrate and the bottommost metallic layer for a superior insulating property.

The most significant characteristics of the present invention lie in the joint effect provided by the non-alloy ohmic contact layer and the first metallic layer in resolving the substrate absorption problem. The first metallic layer functions as a reflective mirror and is made of a pure metal or a metal nitride for superior reflectivity. Since pure metal or metal nitride is used to substitute the conventional alloy reflective mirror so as to avoid the poor reflectivity from alloy metal or high annealing temperature, the non-alloy ohmic contact layer is interposed between the light generating structure and the first metallic layer so as to achieve the required low resistance electrical conduction. The material used for the non-alloy ohmic contact layer could be optically transparent or absorbing. For optically absorbing non-alloy ohmic contact layer, a number of recesses could be optionally formed along the bottom surface so as to reduce light absorption and to improve injection current distribution. For transparent non-alloy ohmic contact layer, recesses could still be formed for improving injection current distribution.

To further prevent the first metallic layer from intermixing with the non-alloy ohmic contact layer and the light generating structure, and to maintain the flatness of the reflective surface of the first metallic layer, an optically transparent and electrically conductive first dielectric layer could be interposed between the first metallic layer and the non-alloy ohmic contact layer. Additionally, to achieve superior bonding between the substrate and the first metallic layer, at least an additional metallic layer could be interposed between the first metallic layer and the substrate. Similarly, to prevent the additional metallic layer from intermixing with the first metallic layer and thereby compromising the reflectivity of the first metallic layer, a second dielectric layer could be interposed between the first metallic layer and the additional metallic layer.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIGS. 3a-3f are schematic sectional views showing the process of forming the structure depicted in FIG. 2a.

DETAILED DESCRIPTION OF THE PREFERRED EMBODIMENTS

The following descriptions are exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1A:
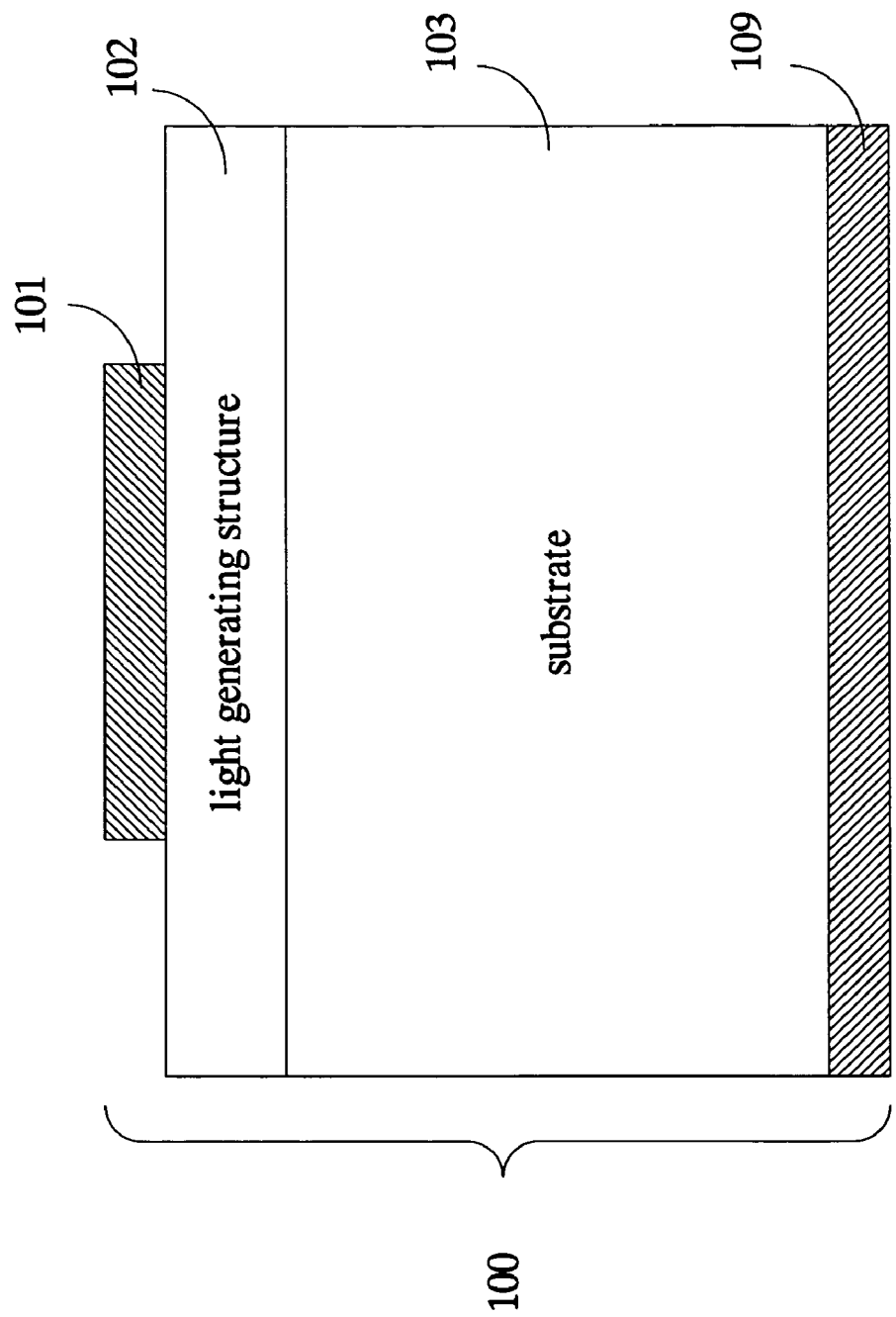
FIG. 1a is a schematic sectional view showing a typical structure of a conventional LED.
Figure 1B:
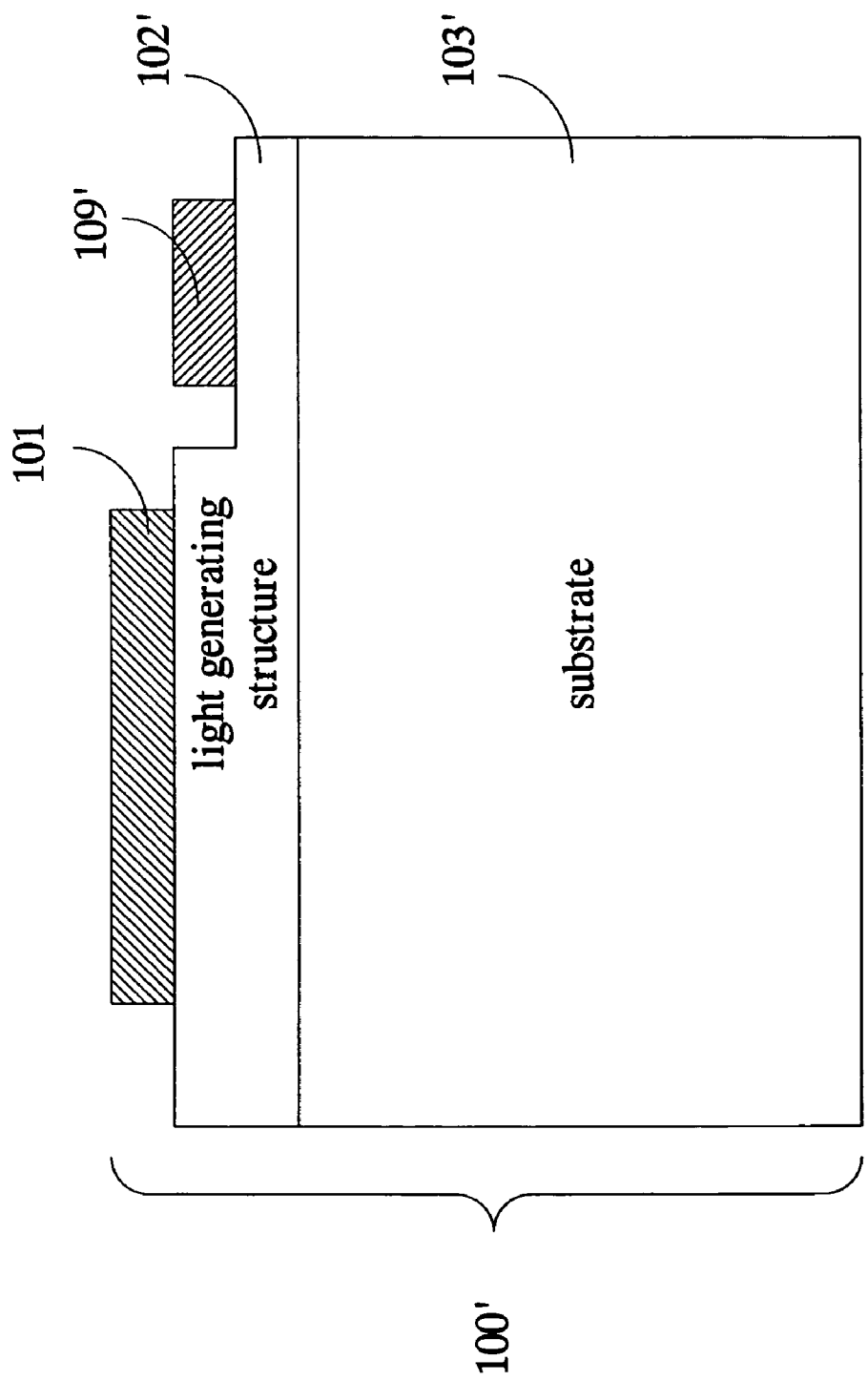
FIG. 1b is a schematic sectional view showing another typical structure of a conventional LED.
Figure 2A:
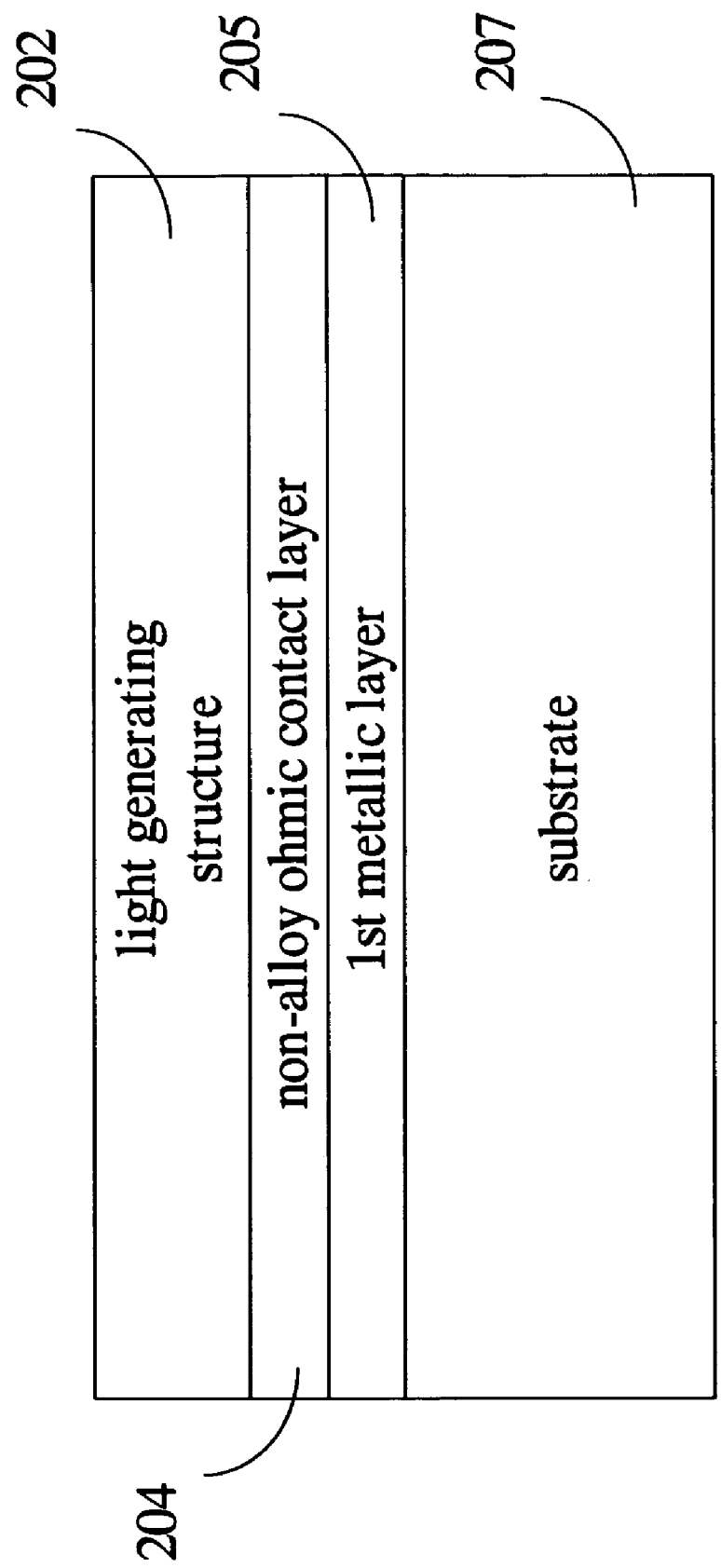
FIG. 2a is a schematic sectional view showing an LED structure according to a first embodiment of the present invention.

FIG. 2a is a schematic sectional view showing the structure of an LED according to a first embodiment of the present invention. As illustrated, the LED structure contains a light generating structure 202. The light generating structure 202 includes active p-n junction layers for generating lights in response to the conduction of current. The light generating structure 202 usually contains, but not limited to, a number of III-V compound semiconductor layers. The exact details of the light generating structure 202 are not critical to the present invention. For ease of reference, all directions towards or locations closer to the light generating structure 202 are referred to as the top direction or upper location, and the opposite as the bottom direction or lower location within FIGS. 2a-2i.

The light generating structure 202 is on top of a first metallic layer 205. The first metallic layer 205 functions as a reflective mirror and, therefore, lights emitted from the light generating structure 202 toward the first metallic layer 205 would be reflected and directed back toward the light generating structure 202. The first metallic layer 205 is made of a pure metal or a metal nitride such as Au, Al, Ag, Titanium Nitride ($TiN_x$), Zirconium Nitride ($ZrN_x$). Since pure metal or metal nitride is used to substitute the conventional alloy reflective mirror so as to achieve superior reflectivity and to avoid the high annealing temperature, a non-alloy ohmic contact layer 204 is interposed between the light generating structure 202 and the first metallic layer 205 to achieve the required low resistance electrical conduction.

The non-alloy ohmic contact layer 204 is, but not limited to, an optically transparent or absorbing, or carbon-doped, semiconductor layer usually having a doping density at least $1E19/cm^3$. Unlike conventional p-type ohmic contact layers using Mg or Zn as dopants that can only achieve a doping density around $1E18~1E19/cm^3$ and, with such a limited doping density, is rather difficult, if not impossible, to form direct ohmic contact with metals or conductive oxides such as ITO, the instant invention's use of carbon as dopant can have a doping density easily above $1E19/cm^3$, even up to $4E19/cm^3 \sim 2E20/cm^{-3}$. With such a high doping density, the non-alloy ohmic contact layer 204 is able to form ohmic contact directly with the first metallic layer 205, as well as conductive oxides. Typical examples of the non-alloy ohmic contact layer 204 includes, but is not limited to: carbon-doped AlAs, carbon-doped GaP, carbon-doped AlP, carbon-doped AlGaAs, carbon-doped InAlAs, carbon-doped InGaP, carbon-doped InAlP, carbon-doped AlGaP, carbon-doped GaAsP, carbon-doped AlAsP, carbon-doped AlGaInP, carbon-doped AlGaInAs, carbon-doped InGaAsP, carbon-doped AlGaAsP, carbon-doped AlInAsP, and carbon-doped InGaAlAsP. Please note that some of the above doped compound semiconductors, depending on the constituent element composition, could be either optically transparent or optically absorbing.

Figure 2B:
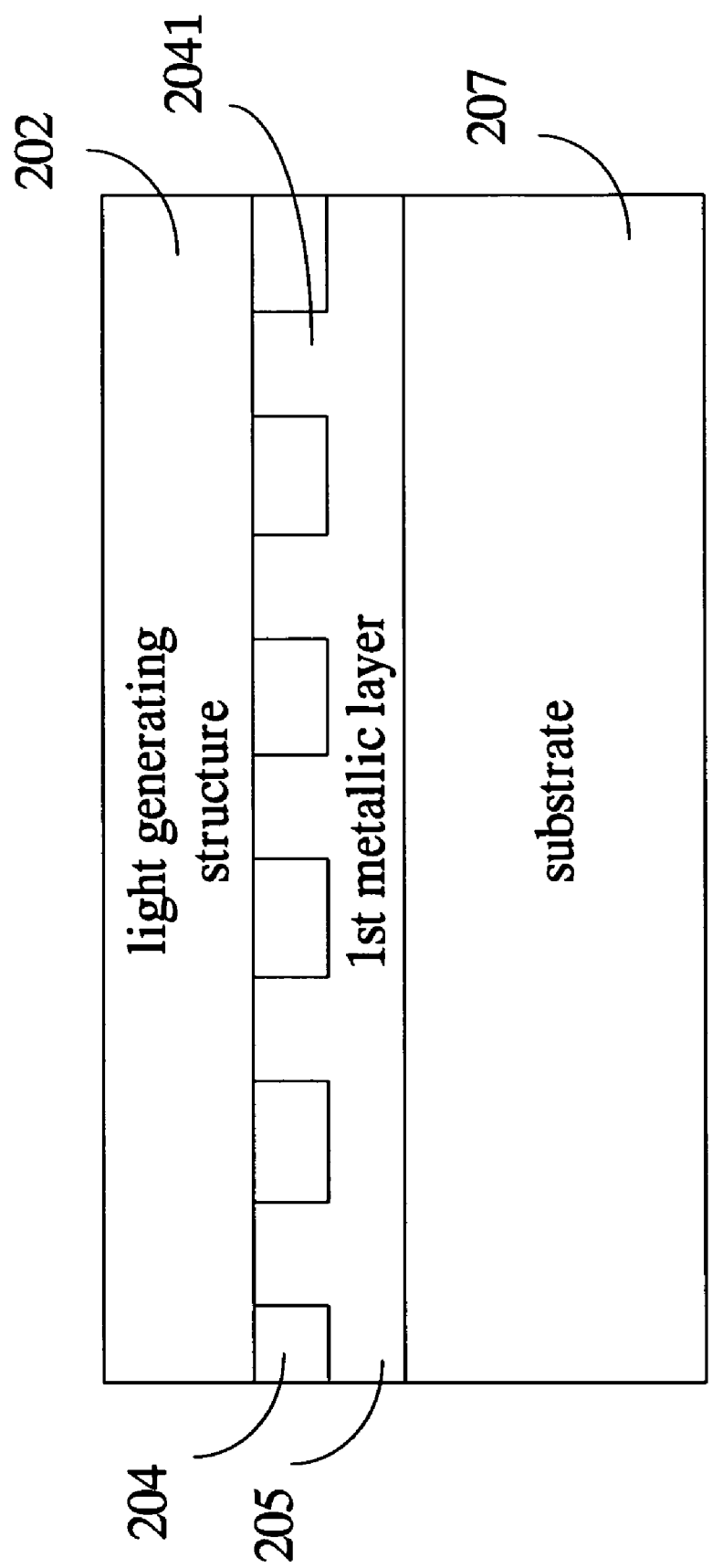
FIG. 2b is a schematic sectional view showing an LED structure according to a second embodiment of the present invention.

Please note that the non-alloy ohmic contact layer 204, after its deposition in another embodiment, could be optionally etched to form a number of recesses 2041, as illustrated in FIG. 2b. The benefit of having the recesses 2041 is that they help controlling the injection current distribution. Another benefit of the recesses 2041 is that they reduce light absorption when the non-alloy ohmic contact layer 204 is made of an optically absorbing material. The depth of the etching is usually such that part of the light generating structure 202 is exposed.

Figure 2C:
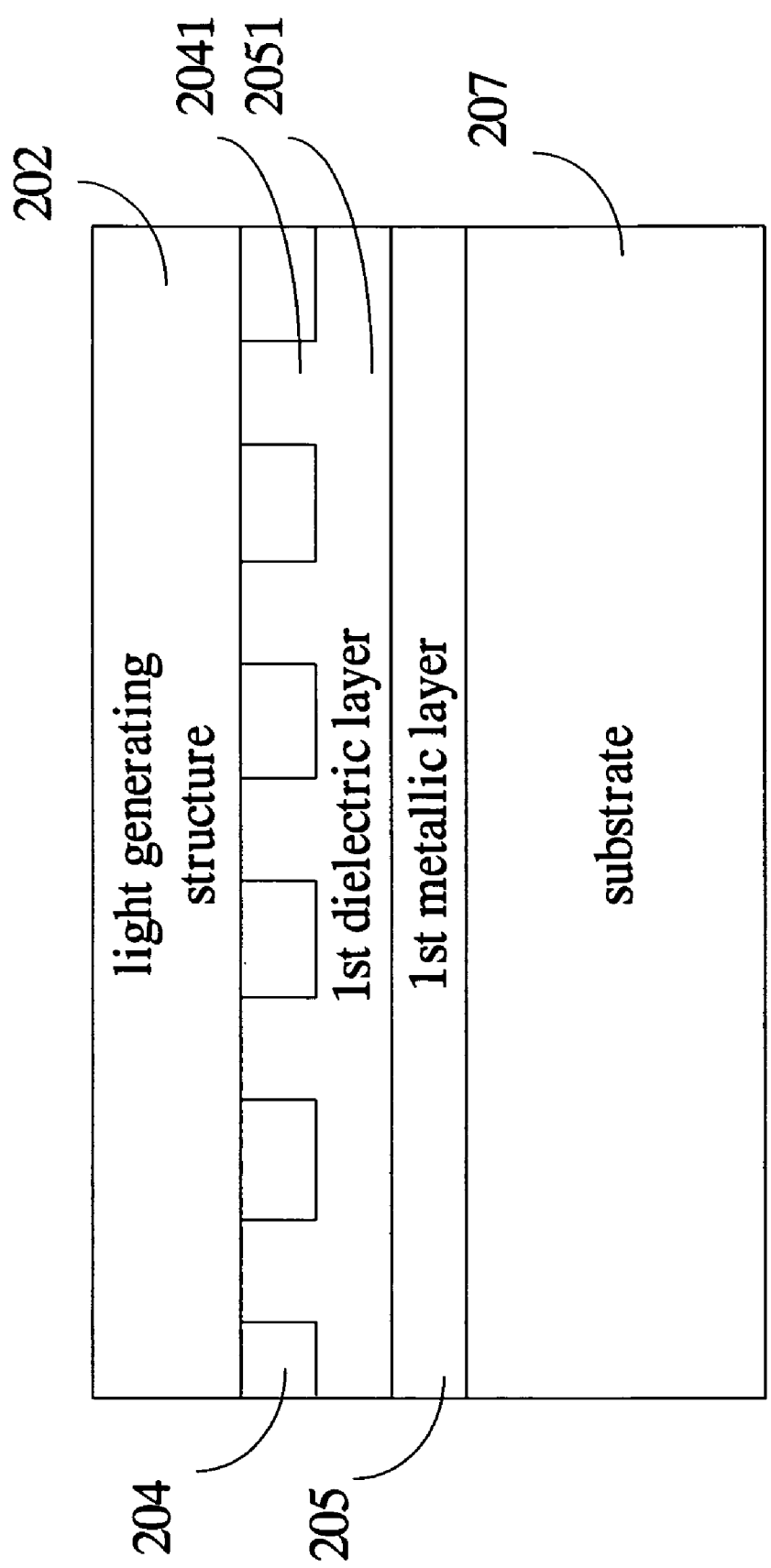
FIG. 2c is a schematic sectional view showing an LED structure according to a third embodiment of the present invention.

In an alternative embodiment, as depicted in FIG. 2c, an optically transparent and electrically conductive first dielectric layer 2051 could be interposed between the first metallic layer 205 and the non-alloy ohmic contact layer 204 for the purpose of preventing the intermixing between the first metallic layer 205 and the non-alloy ohmic contact layer 204, and the light generating structure 202 if there are recesses 2041, so as to maintain the reflectivity and the reflective surface flatness of the first metallic layer 205. The first dielectric layer 2051 is usually made of a transparent conductive oxide (TCO). Typical examples include, but are not limited to, Indium Tin Oxide (ITO), Indium Zinc Oxide (IZO), Tin Oxide (SnO), Antimony-doped SnO, Fluorine-doped SnO, Phosphorus-doped SnO, Zinc Oxide (ZnO), Aluminum-doped ZnO, Indium Oxide (mO), Cadmium Oxide (CdO), Cadmium Stannate (CTO), Copper Aluminum Oxide (CuAlO), Copper Calcium Oxide (CuCaO), and Strontium Copper Oxide (SrCuO).

Figure 2D:
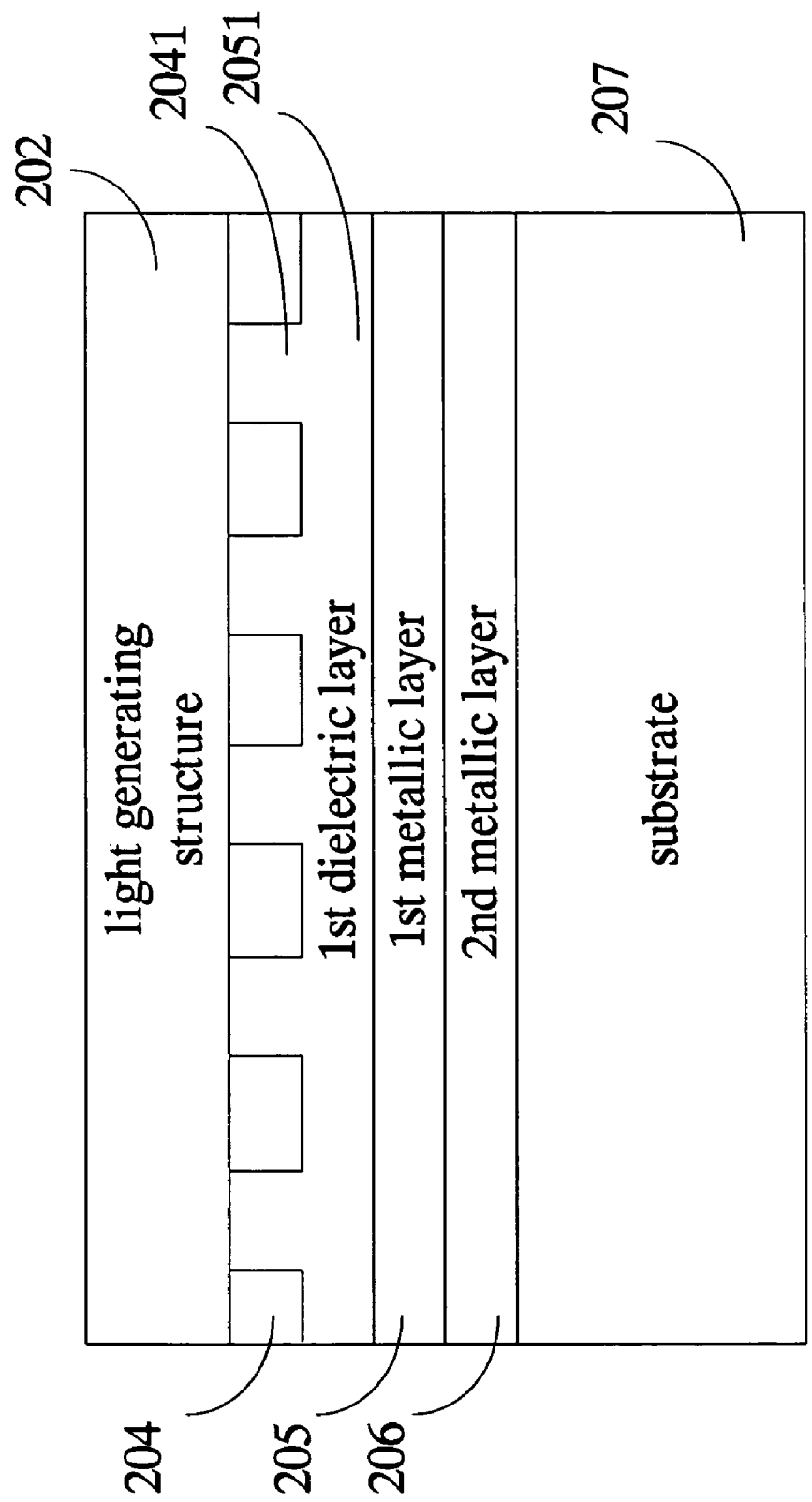
FIG. 2d is a schematic sectional view showing an LED structure according to a fourth embodiment of the present invention.
Figure 2E:
FIG. 2e is a schematic sectional view showing an LED structure according to a fifth embodiment of the present invention.

In another embodiment, as illustrated in FIG. 2d, a second metallic layer 206 could be positioned between the substrate 207 and the first metallic layer 205. The second metallic layer 206, made of a pure metal or an alloy metal, is for enhancing the bonding to the substrate 207 in a wafer bonding process for forming an LED structure of the present invention. An exemplary fabrication process of the present invention will be given later. Similarly, to prevent the second metallic layer 206 from intermixing with the first metallic layer 205 and to maintain the reflectivity of the first metallic layer 205, a second dielectric layer 2061 could be positioned between the first and the second metallic layers 205 and 206, as illustrated in FIG. 2e.

Please note that, as the first metallic layer 205 functions as a reflective mirror, the optical characteristic of the second dielectric layer 2061 is of no significance. In addition, if the LED structure of FIG. 2e is to have its electrodes arranged in a vertical fashion, the second dielectric layer 2061 has to be electrically conductive so that a conduction path could be established between the electrodes. If the LED structure of FIG. 2e is to have its electrodes arranged in a planar fashion, whether the second dielectric layer 2061 is electrically conductive or not would affect the placement of one of the planar electrodes. More details about this will be given later.

Figure 2F:
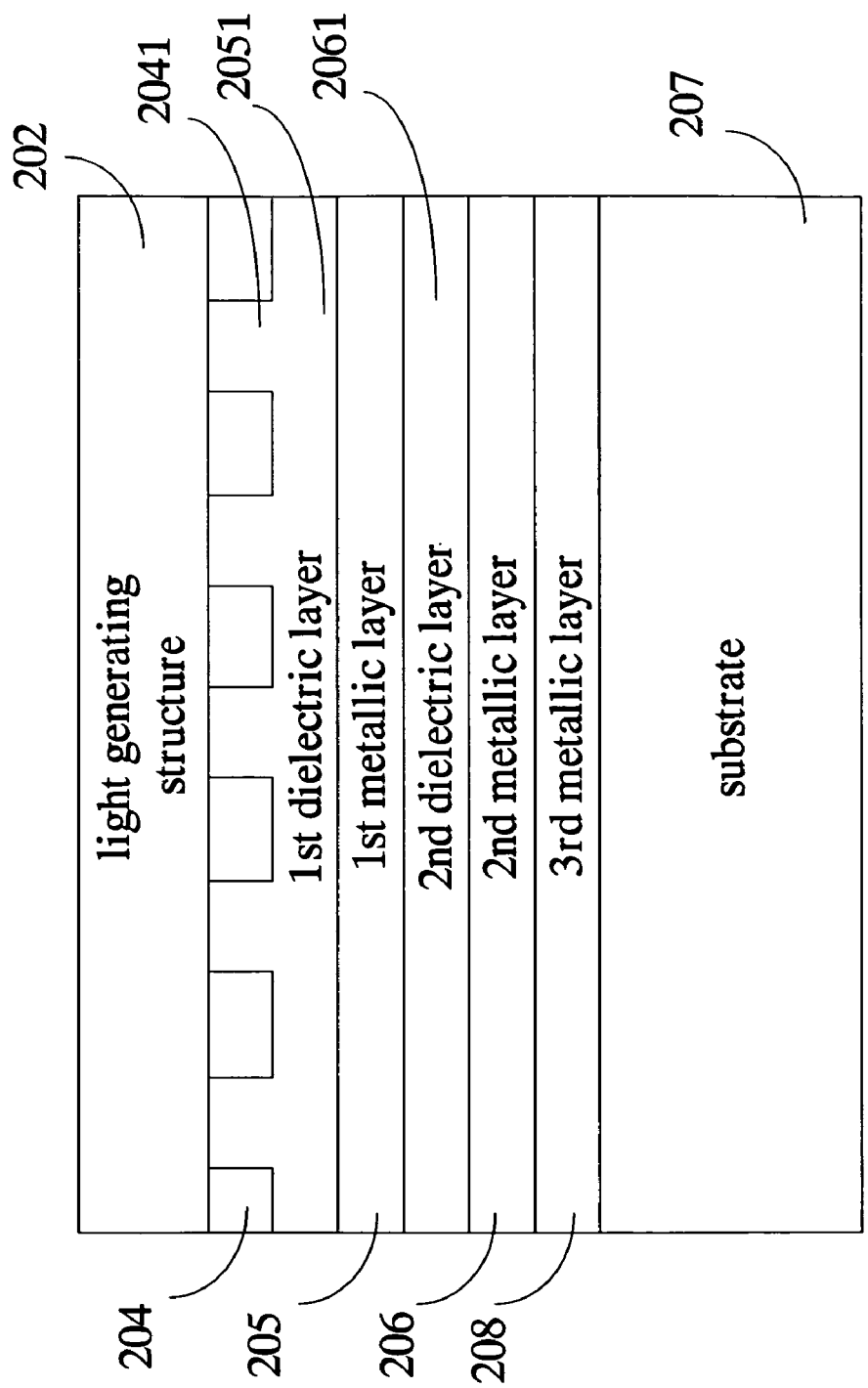
FIG. 2f is a schematic sectional view showing an LED structure according to a sixth embodiment of the present invention.

Please also note that there could be additional pairs of dielectric layer and metallic layer between the second metallic layer 206 and the substrate 207. Similarly, these additional dielectric layers are not required to be optically transparent and electrically conductive, and these additional metallic layers could be made of a pure metal or an alloy metal. For second dielectric layer 2061 and those additional dielectric layers, as described above, they could be made of a transparent conductive oxide such as ITO, IZO, SnO, Antimony-doped SnO, Fluorine-doped SnO, Phosphorus-doped SnO, ZnO, Aluminum-doped ZnO, InO, CdO, CTO, CuAlO, CuCaO, SrCuO, a metal nitride such as $TiN_x$, $ZrN_x$ (which are not optically transparent), or an insulating material such as Silicon Nitride ($SiN_x$), Silicon Oxide ($SiO_x$). FIG. 2f is yet another embodiment of the present invention. As illustrated, there could be a third metallic layer 208 on top of the substrate 207 which is made of a pure or alloy metal, and whose purpose is also for enhancing the performance of the aforementioned wafer-bonding process. More details will be given in the exemplary fabrication process below.

Since the first metallic layer 205 would reflect most (if not all) of the lights incident toward the substrate 207, the optical characteristic of the substrate 207 is of no significance. The substrate 207 could be a semiconductor substrate, a metallic substrate, or other appropriate substrate. The substrate 207 could be electrically conductive or non-electrically conductive. Typical material choice for the electrically conductive substrate 207 includes, but is not limited to: doped Ge, doped Si, doped GaAs, doped GaP, doped InP, doped InAs, doped GaN, doped AlGaAs, doped SiC, doped GaAsP, Mo, Cu, and Al. Typical material choice for the non-electrically conductive substrate 207' includes, but is not limited to: Ge, Si, GaAs, GaP, InP, InAs, GaN, AlN, AlGaAs, SiC, GaAsP, sapphire, glass, quartz, and ceramic.

Figure 2G:
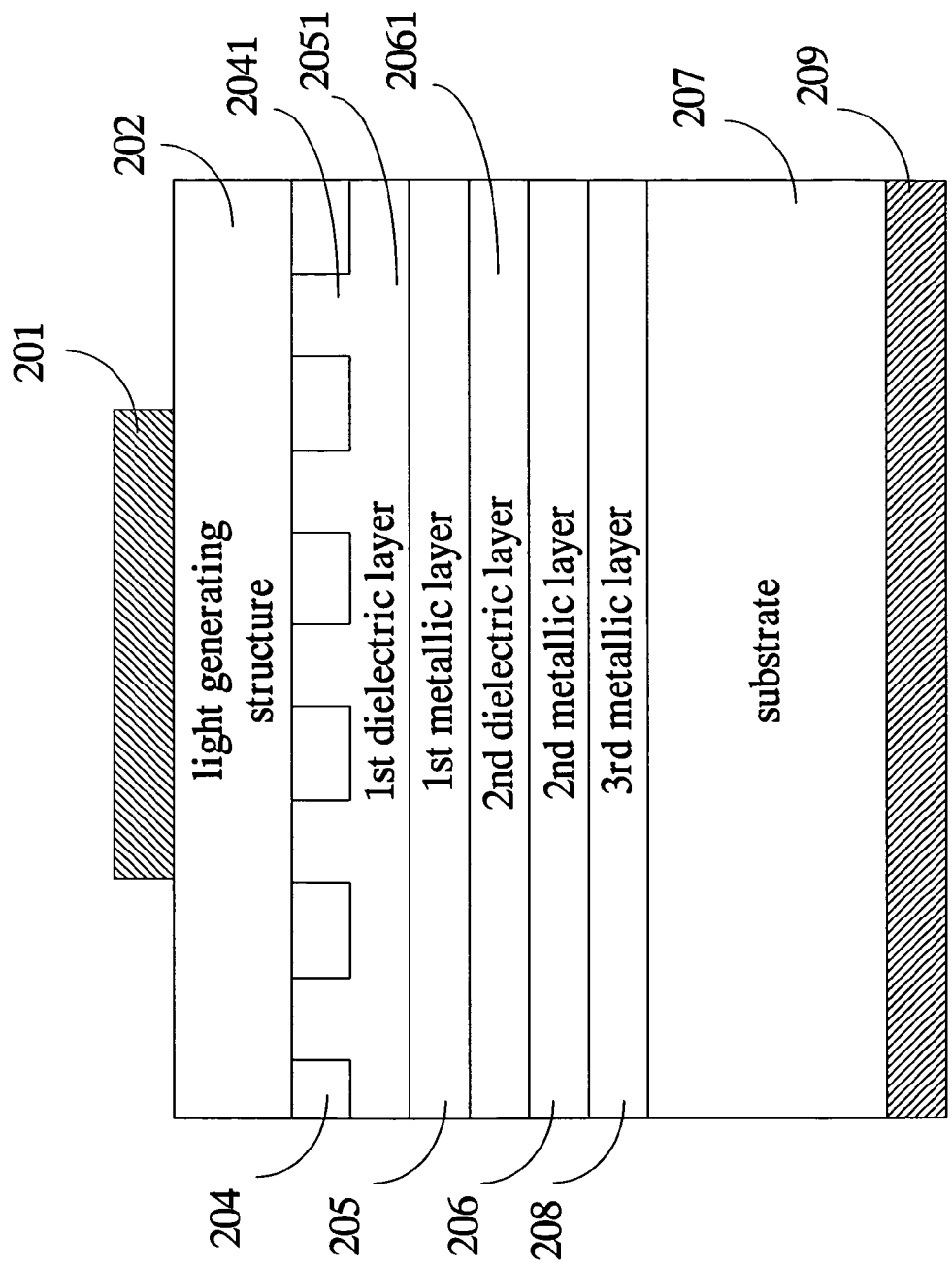
FIGS. 2g-2i are schematic sectional views showing the formation of electrodes on the LED structures according to embodiments of the present invention.
Figure 2H:
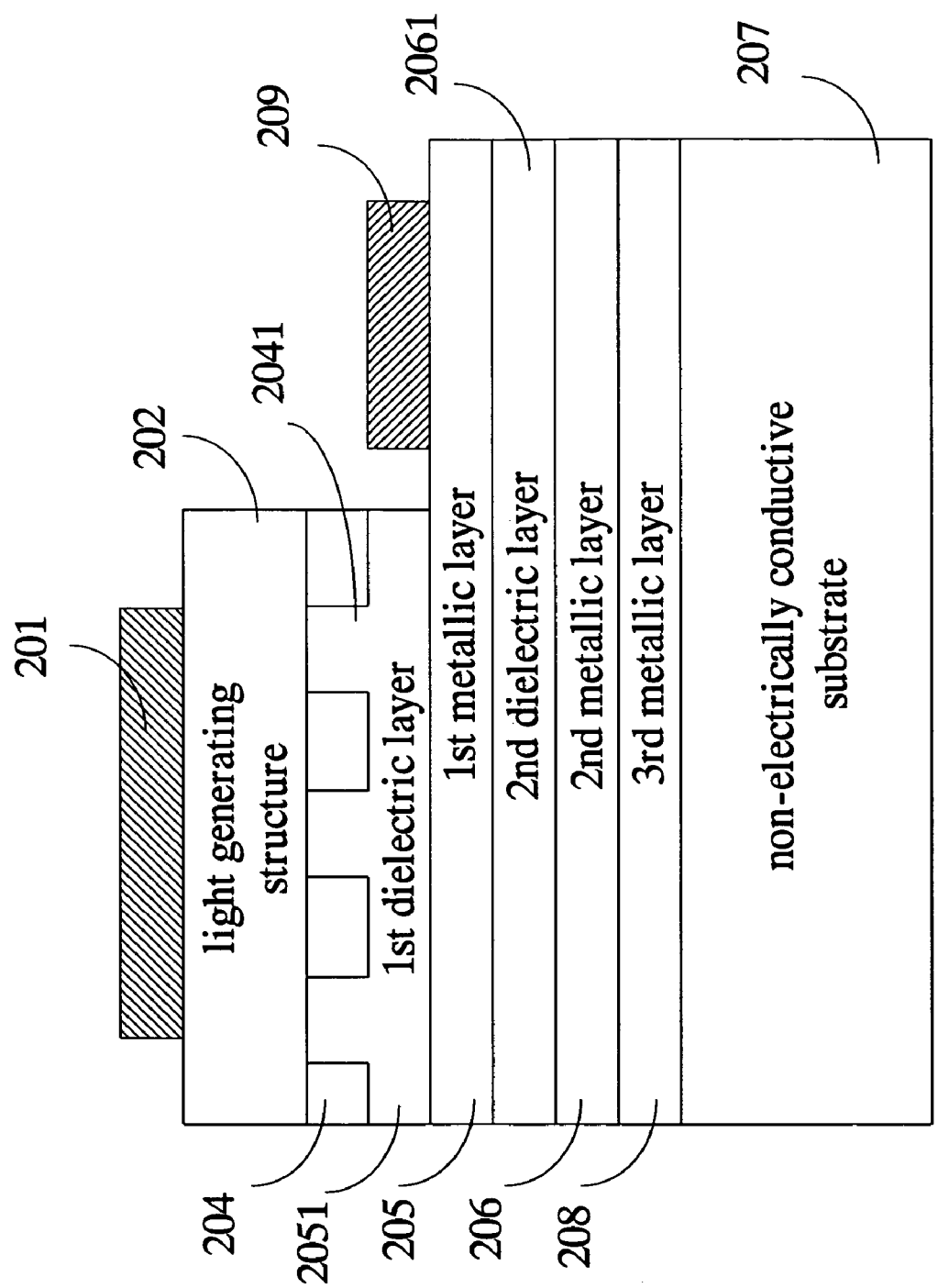

If the substrate 207 is electrically conductive, the electrodes 201 and 209 could be configured in a vertical arrangement during a subsequent chip process, as shown in FIG. 2g. If the substrate 207 is non-electrically conductive, the electrodes 201 and 209 have to be arranged in a planar fashion. As illustrated in FIG. 2h, part of the LED structure as depicted in FIG. 2f is etched up to an appropriate depth so that a region of one of the metallic layers located between the non-alloy ohmic contact layer 204 and the substrate 207 is exposed. In this embodiment, it is etched so that a region of the first metallic layer 205 is exposed. The electrodes 201 and 209 are then formed on the light generating structure 202 and the exposed region of the first metallic layer 205 respectively. Please note that, if there are multiple metallic layers and as long as there is a conduction path between the electrodes 201 and 209, there is no specific constraint on how far down the LED structure the etching could go. For example, in FIG. 2i, the LED structure is etched until a region of the second metallic layer 206 is exposed. As mentioned earlier, whether the second dielectric layer 2061 is electrically conductive or not would affect the placement of one of the planar electrodes. Therefore, for the planar arrangement of the electrodes 201 and 209 in FIG. 2i to work, the second dielectric layer 2061 has to be electrically conductive. On the other hand, the second dielectric layer 2061 in FIG. 2h could be non-electrically conductive as it is not on the conduction path between the electrodes 201 and 209.

Figure 2I:
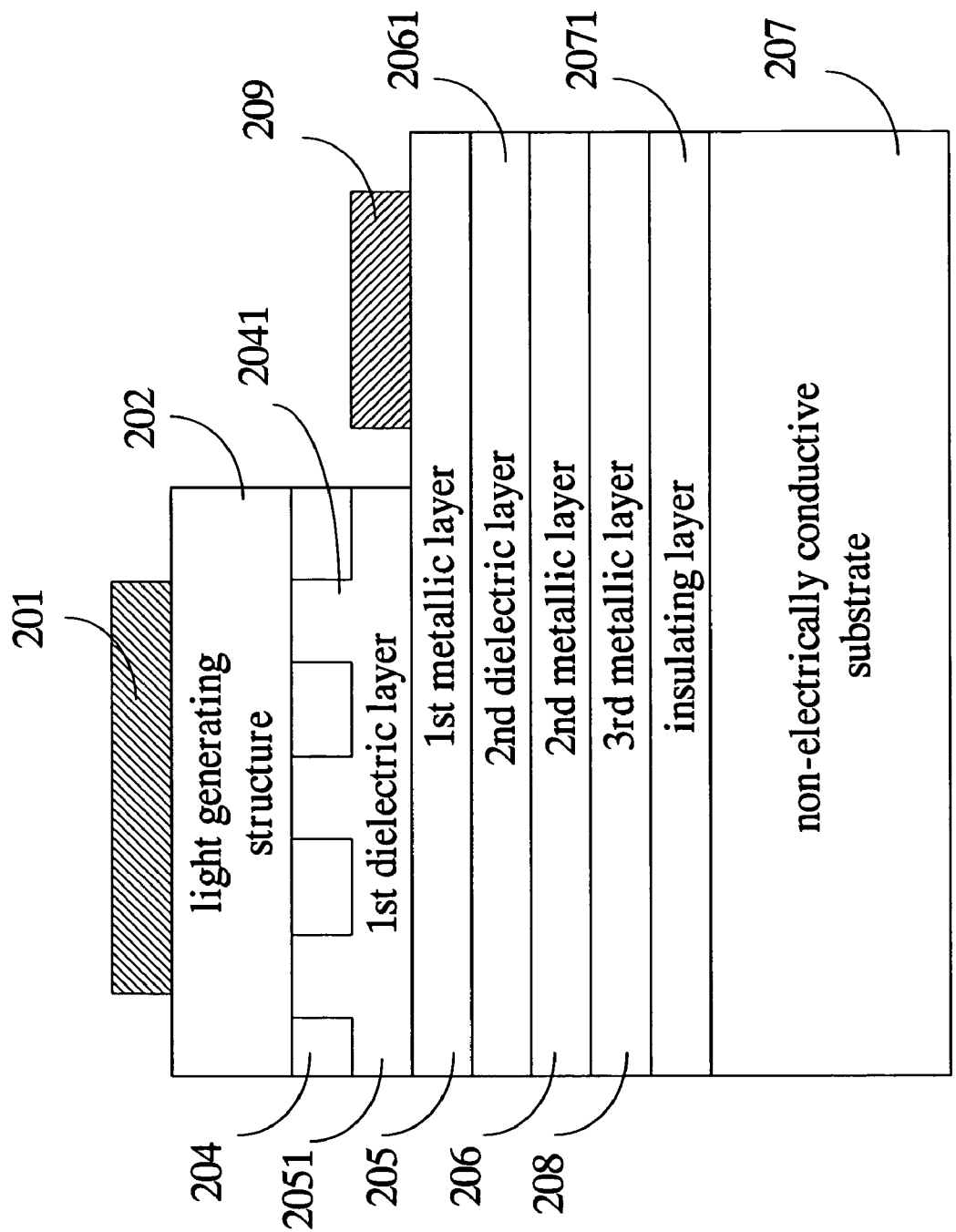

If the substrate 207 is electrically conductive, the electrodes 201 and 209 could still be arranged in a planar fashion as depicted in FIG. 2i. Similarly, the LED structure is etched so that a region of the second metallic layer 206 is exposed. The electrodes 201 and 209 are then formed on the light generating structure 202 and the exposed region of the second metallic layer 206 respectively. Please note that, since the substrate 207 is electrically conductive, an insulating layer 2071 is positioned immediately on top of the substrate 207 and beneath the bottommost metallic layer. The insulating layer 2071 is made of one of the following materials: $SiN_x$ and $SiO_x$. Please note that it is possible to have no insulating layer 2071 if at least one of the second dielectric layer 2061 and the additional dielectric layers is non-electrically conductive. However, as the dielectric layers usually couldn't provide the required insulation, the insulating layer 2071 is still implemented. Please note that, for an even better insulation property, the insulating layer 2071 could be implemented in FIG. 2h (with non-electrically conductive substrate 207) as well.

Figure 3A:
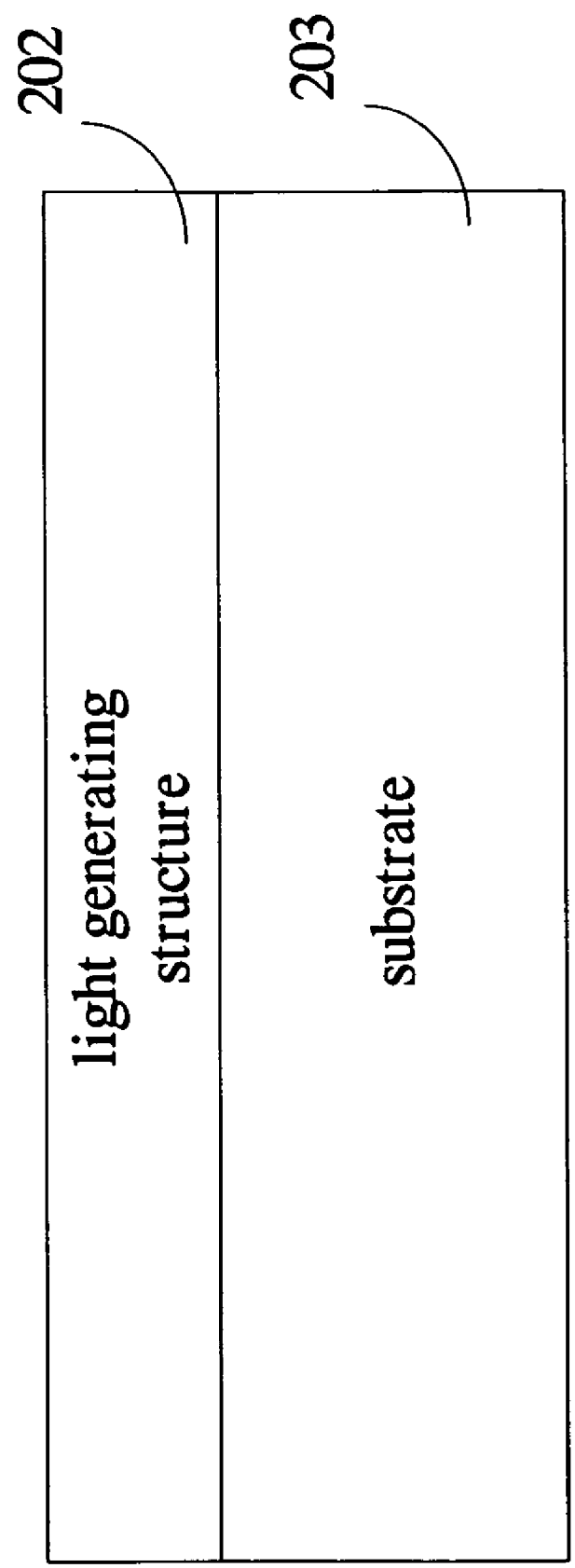

FIGS. 3a-3f are schematic sectional views showing the process for forming the structure of FIG. 2g. As illustrated in FIG. 3a, a temporary growth substrate 203 is first provided and, then, a number of semiconductor layers forming the light generating structure 202 are sequentially grown on a side of the temporary growth substrate 203. The main consideration of substrate 203 is to achieve better luminous efficiency from the light generating structure 202. For example, substrate 203 is made of a material such as GaAs so that it is lattice-matched to the light generating structure 202.

Figure 3B:
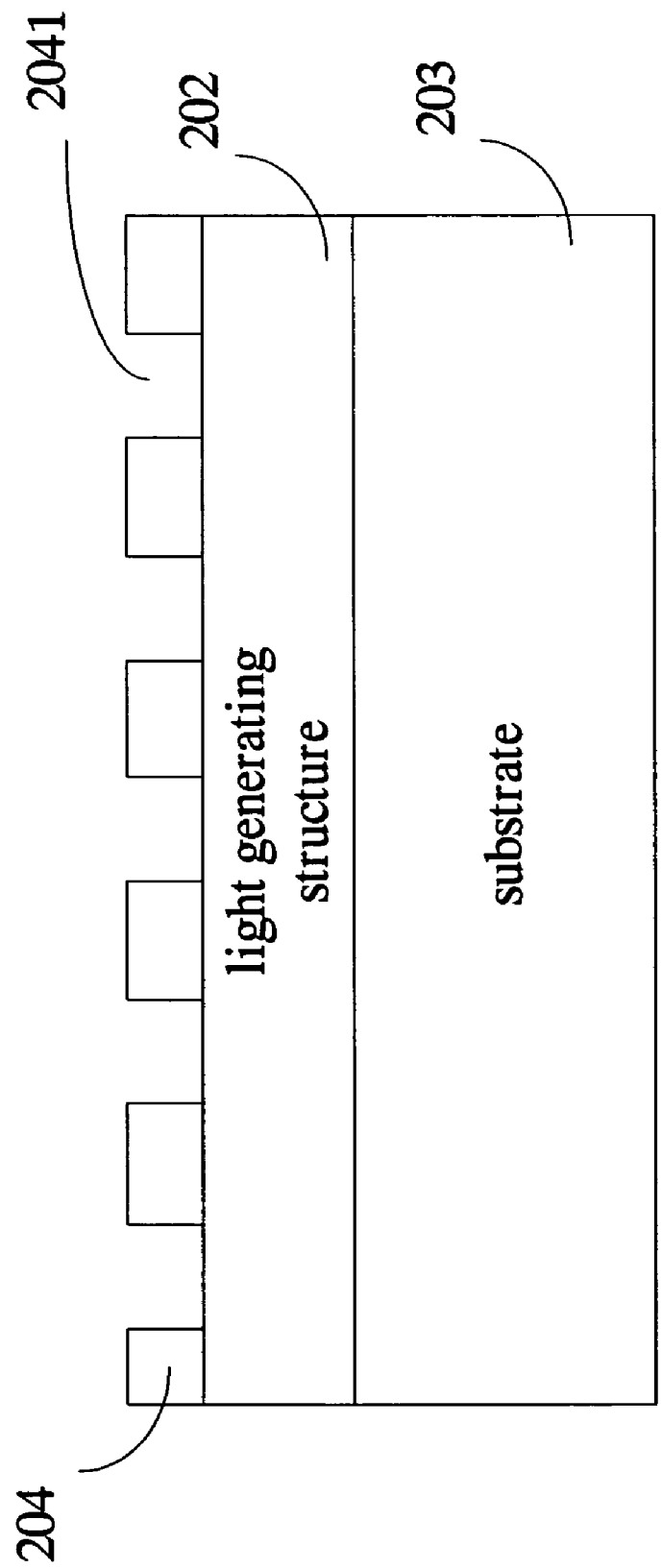

Then, as shown in FIG. 3b, the non-alloy ohmic contact layer 204 is subsequently deposited on the light generating structure 202 using epitaxal growth tools, vacuum evaporation, deposition, sputtering, or plating techniques. The forming of the non-alloy ohmic contact layer 204 can be performed right after the first growth process for the light generating structure 202 in the same reactor. In alternative embodiments, the epitaxial structure containing the light generating structure 202 and substrate 203 is prepared and stored separately. Then the non-alloy ohmic contact layer 204 is deposited on the stored epitaxial structure. To improve the injection current distribution and/or reduce light absorption by the non-alloy ohmic contact layer 204, a number of recesses 2041 are configured by etching on the surface of the non-alloy ohmic contact layer 204.

Figure 3C:
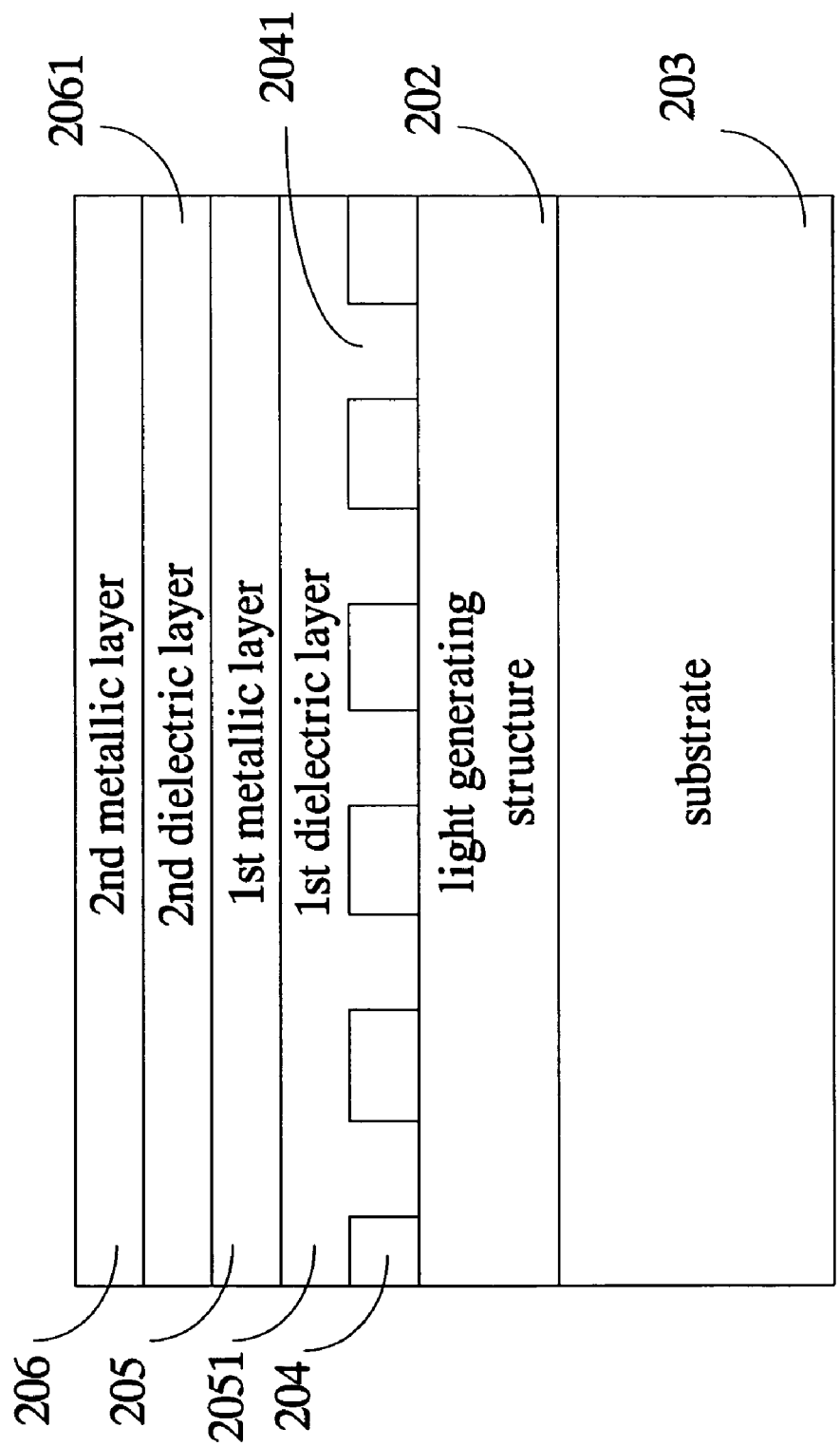

Then, as shown in FIG. 3c, the first dielectric layer 2051, the first metallic layer 205, the second dielectric layer 2061, and the second metallic layer 206 are sequentially coated on the non-alloy ohmic contact layer 204 using vacuum evaporation, deposition, sputtering, or plating techniques.

Figure 3D:
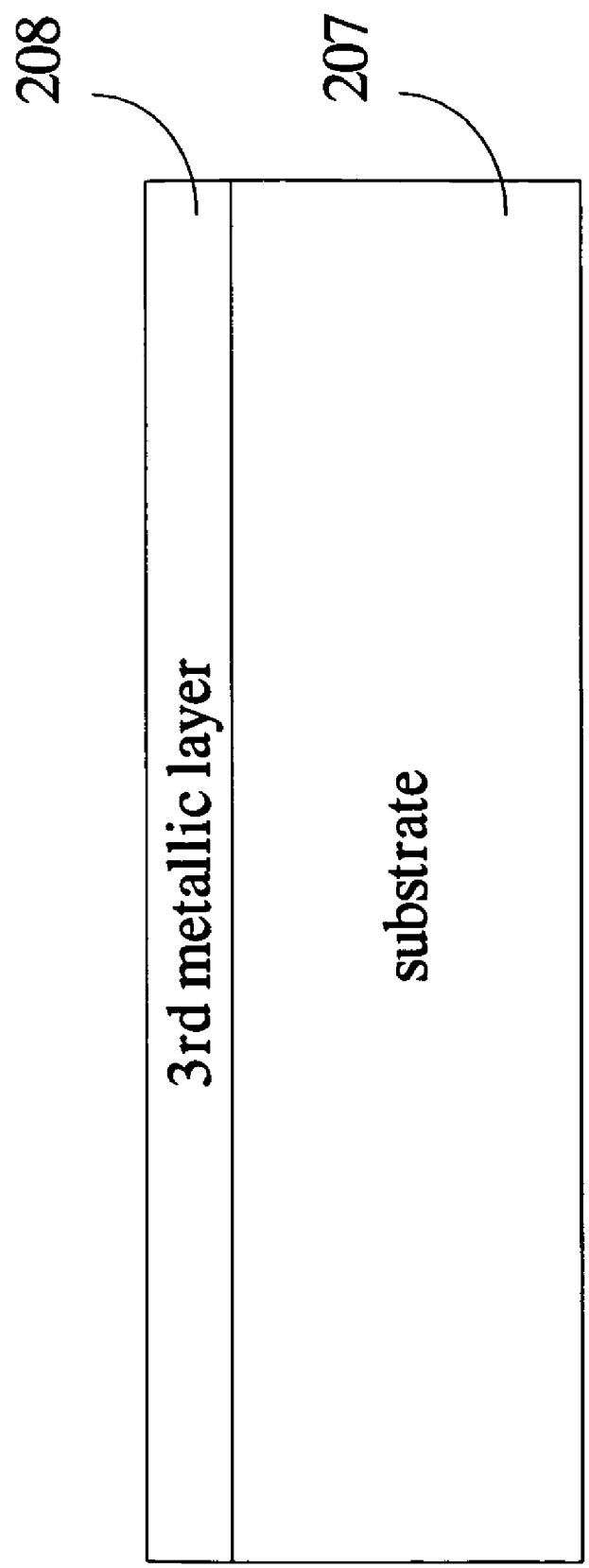

Then, an electrically conductive permanent substrate 207 is provided and the third metallic layer 208 is deposited on a side of the permanent substrate 207 using vacuum evaporation, deposition, sputtering, or plating techniques, as shown in FIG. 3d.

Figure 3E:
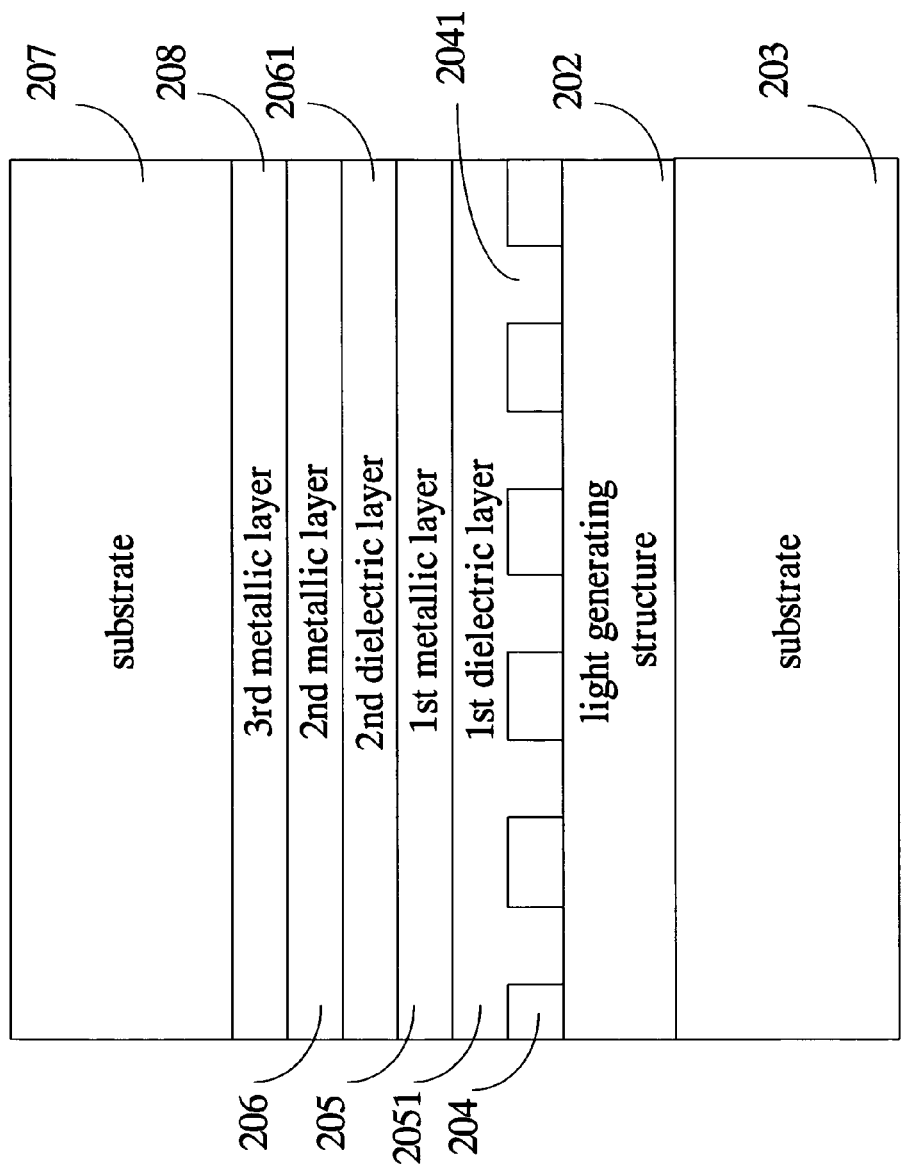

Then, a wafer bonding process is conducted to join the structure of FIG. 3c and the structure of FIG. 3d, with the second metallic layer 206 interfacing with the third metallic layer 208, as shown in FIG. 3e. Please note that the metallic layers 206 and 208 function as bonding agents during the wafer-bonding process and this would significantly simplify the wafer bonding process with a significantly lower annealing temperature and shorter operation period. In addition, the third metallic layer 208 also provides the required ohmic contact to the substrate 207.

Compared to prior arts that wafer-bond the reflective mirror to the light generating structure, the present invention directly coats the first metallic layer 205 (i.e., the reflective mirror) on the light generating structure 202 in vacuum prior to the wafer-bonding process. The mirror's reflective surface is not directly involved in the bonding interface during the wafer-bonding process. Therefore, roughness of the reflective surface or reactions and contaminations to the mirror's reflective surface can be avoided. The first metallic layer 205 of the present invention thereby offers a much superior reflectivity than the reflective mirrors formed using prior arts.

Figure 3F:
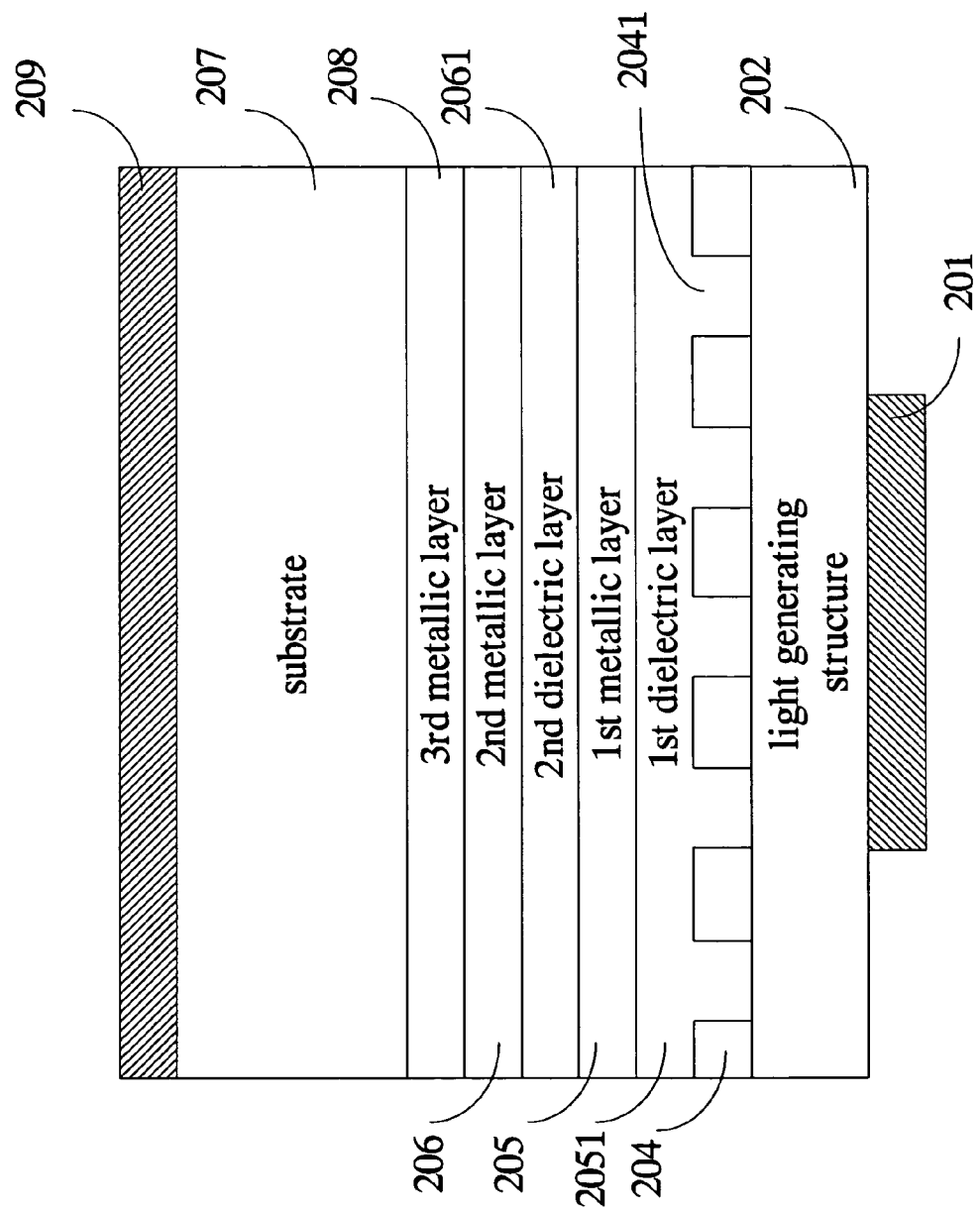

The temporary growth substrate 203 is then removed. As the removal of the temporary growth substrate 203 is performed after the light generating structure 202 is bonded to the permanent substrate 207, the problem of light generating structure 202 being too thin to handle is avoided accordingly. Up to this point, an LED structure according to the present invention is formed. Subsequently, a conventional chip process could be conducted to package the LED structure into a chip. This involves placing two metal films on the top and bottom sides of the structure as electrodes 209 and 201 respectively, as shown in FIG. 3f.

Please note that an LED structure as depicted in FIG. 2h or FIG. 2i could be formed using basically identical process. The differences lie in that, first, in FIG. 3d, the electrical property of the permanent substrate 207 has to be decided appropriately. Secondly, prior to forming the electrodes, part of the LED structure is etched from the light generating structure 202 up to an appropriate depth until reaching one of the metallic layers. And, thirdly, electrodes 201 and 209 are formed on the light generating structure 202 and the exposed metallic layer respectively.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A light emitting diode structure having a plurality of layers positioned sequentially from bottom to top, comprising:
    a substrate;
    a first metallic layer made of one of a pure metal and a metal nitride above said substrate;
    a non-alloy ohmic contact layer made of a carbon-doped semiconductor above said first metallic layer; and
    a light generating structure above said non-alloy ohmic contact layer which generates lights in response to the conduction of current through said light emitting diode structure.

2. The light emitting diode structure as claimed in claim 1, wherein said first metallic layer is made of one of the following materials: Au, Al, Ag, $TiN_x$, and $ZrN_x$.

3. The light emitting diode structure as claimed in claim 1 further comprising an optically transparent and electrically conductive first dielectric layer positioned between said first metallic layer and said non-alloy ohmic contact layer.

4. The light emitting diode structure as claimed in claim 3, wherein said first dielectric layer is made of a transparent conductive oxide.

5. The light emitting diode structure as claimed in claim 4, wherein said first dielectric layer is made of one of the following materials: ITO, IZO, SnO, Antimony-doped SnO, Fluorine-doped SnO, Phosphorus-doped SnO, ZnO, Aluminum-doped ZnO, InO, CdO, CTO, CuAlO, CuCaO, and SrCuO.

6. The light emitting diode structure as claimed in claim 1 further comprising a second metallic layer positioned between said first metallic layer and said substrate.

7. The light emitting diode structure as claimed in claim 6, wherein said second metallic layer is made of one of a pure metal and an alloy metal.

8. The light emitting diode structure as claimed in claim 6 further comprising a second dielectric layer positioned between said first metallic layer and said second metallic layer.

9. The light emitting diode structure as claimed in claim 8, wherein said second dielectric layer is made of one of the following three types of materials: transparent conductive oxide, metal nitride, and insulating material.

10. The light emitting diode structure as claimed in claim 9, wherein said second dielectric layer is made of one of the following materials: ITO, IZO, SnO, Antimony-doped SnO, Fluorine-doped SnO, Phosphorus-doped SnO, ZnO, Aluminum-doped ZnO, InO, CdO, CTO, CuAlO, CuCaO, SrCuO, $TiN_x$, $ZrN_x$, $SiN_x$, and $SiO_x$.

11. The light emitting diode structure as claimed in claim 6 further comprising a third metallic layer positioned between said second metallic layer and said substrate.

12. The light emitting diode structure as claimed in claim 11, wherein said third metallic layer is made of one of a pure metal and an alloy metal.

13. The light emitting diode structure as claimed in claim 1, wherein said non-alloy ohmic contact layer is made of one of the following materials: carbon-doped AlAs, carbon-doped GaP, carbon-doped AlP, carbon-doped AlGaAs, carbon-doped InAlAs, carbon-doped InGaP, carbon-doped InAlP, carbon-doped AlGaP, carbon-doped GaAsP, carbon-doped AlAsP, carbon-doped AlGaInP, carbon-doped AlGaInAs, carbon-doped InGaAsP, carbon-doped AlGaAsP, carbon-doped AlInAsP, carbon-doped InGaAlAsP, carbon-doped InP, carbon-doped InAs, carbon-doped GaAs, and carbon-doped InAsP.

14. The light emitting diode structure as claimed in claim 1, wherein said non-alloy ohmic contact layer has a plurality of recesses along the interface between said non-alloy ohmic contact layer and said first metallic layer.

15. The light emitting diode structure as claimed in claim 1, wherein said substrate is an electrically conductive substrate.

16. The light emitting diode structure as claimed in claim 15, wherein said substrate is made of one of the following materials: doped Ge, doped Si, doped GaAs, doped GaP, doped InP, doped InAs, doped GaN, doped AlGaAs, doped SiC, doped GaAsP, Mo, Cu, and Al.

17. The light emitting diode structure as claimed in claim 1 further comprising an insulating layer immediately on top of said substrate for a planar arrangement of electrodes of said light emitting diode structure.

18. The light emitting diode structure as claimed in claim 17, wherein said insulating layer is made of one of the following materials: $SiN_x$ and $SiO_x$.

19. The light emitting diode structure as claimed in claim 1, wherein said substrate is a non-electrically conductive substrate.

20. The light emitting diode structure as claimed in claim 19, wherein said substrate is made of one of the following materials: Ge, Si, GaAs, GaP, InP, InAs, GaN, AlN, AlGaAs, SiC, GaAsP, sapphire, glass, quartz, and ceramic.

* * * * *

(12) EX PARTE REEXAMINATION CERTIFICATE (7836th)
United States Patent
Liu et al.

(10) Number: US 7,335,924 C1
(45) Certificate Issued: Oct. 26, 2010

(54) HIGH-BRIGHTNESS LIGHT EMITTING DIODE HAVING REFLECTIVE LAYER

(75) Inventors: Jin-Hsiang Liu, Taipei (TW); Hui-Heng Wang, Taoyuan (TW); Kun-Chuan Lin, Taipei (TW)

(73) Assignee: Huga Optotech Inc., Taichung (TW)

Reexamination Request:
No. 90/010,633, Aug. 3, 2009

Reexamination Certificate for:
Patent No.: 7,335,924
Issued: Feb. 26, 2008
Appl. No.: 11/180,013
Filed: Jul. 12, 2005

(51) Int. Cl.
*H01L 29/22* (2006.01)
*H01L 33/00* (2006.01)

(52) U.S. Cl. .................. 257/98; 257/91; 257/99; 257/103; 257/744; 257/745; 257/E33.063; 257/E33.068; 257/E33.064; 257/E33.005

(58) Field of Classification Search .............. None
See application file for complete search history.

(56) References Cited

U.S. PATENT DOCUMENTS

| | | |
|---|---|---|
| 5,376,580 A | 12/1994 | Kish et al. |
| 6,350,997 B1 | 2/2002 | Saeki |
| 6,479,836 B1 | 11/2002 | Suzuki et al. |
| 6,797,987 B2 | 9/2004 | Chen |
| 6,998,642 B2 | 2/2006 | Lin et al. |
| 7,078,735 B2 | 7/2006 | Shono et al. |

*Primary Examiner*—Erik Kielin

(57) ABSTRACT

An LED structure is disclosed herein, which comprises, sequentially arranged in the following order, a light generating structure, a non-alloy ohmic contact layer, a metallic layer, and a substrate. As a reflecting mirror, the metallic layer is made of a pure metal or a metal nitride for achieving superior reflectivity. The non-alloy ohmic contact layer is interposed between the metallic layer and the light generating structure so as to achieve the required ohmic contact. To prevent the metallic layer from intermixing with the non-alloy ohmic contact layer and to maintain the flatness of the reflective surface of the first metallic layer, an optional dielectric layer is interposed between the metallic layer and the non-alloy ohmic contact layer.

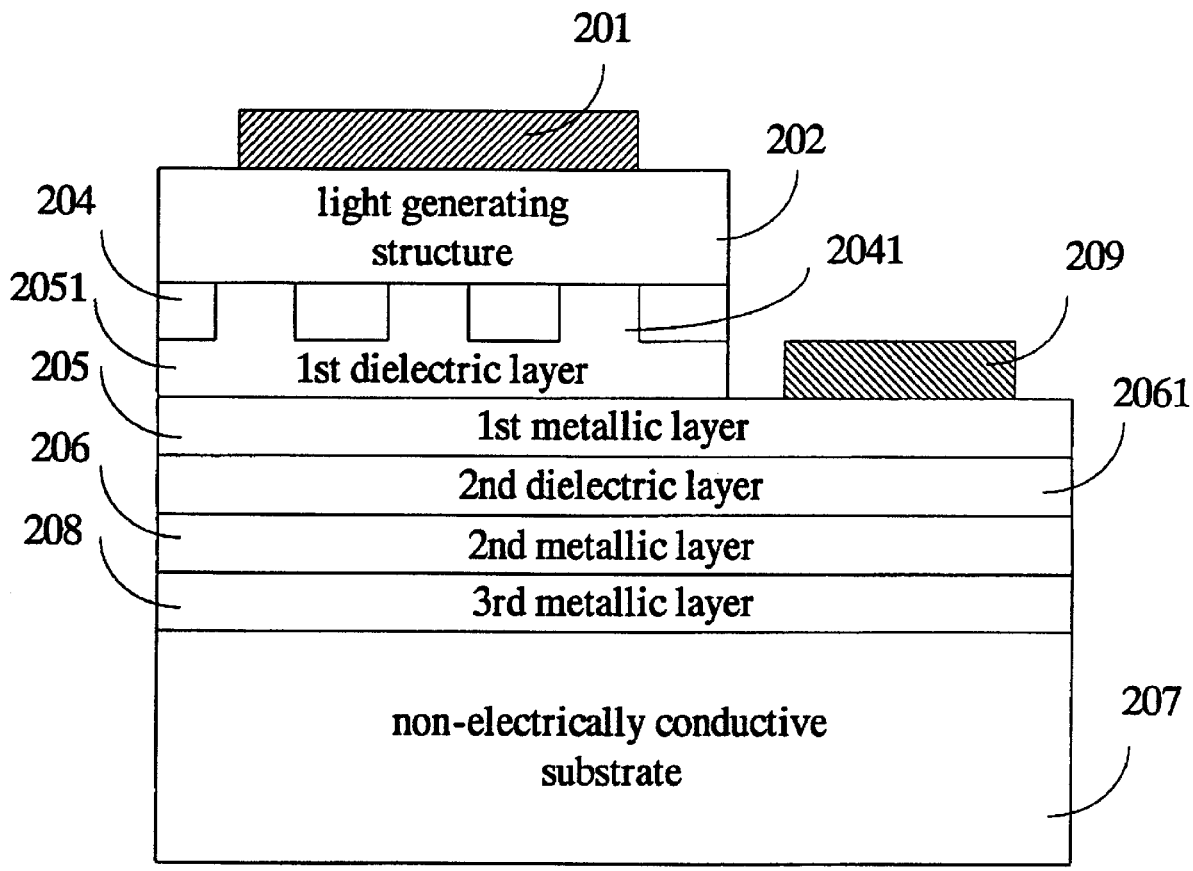

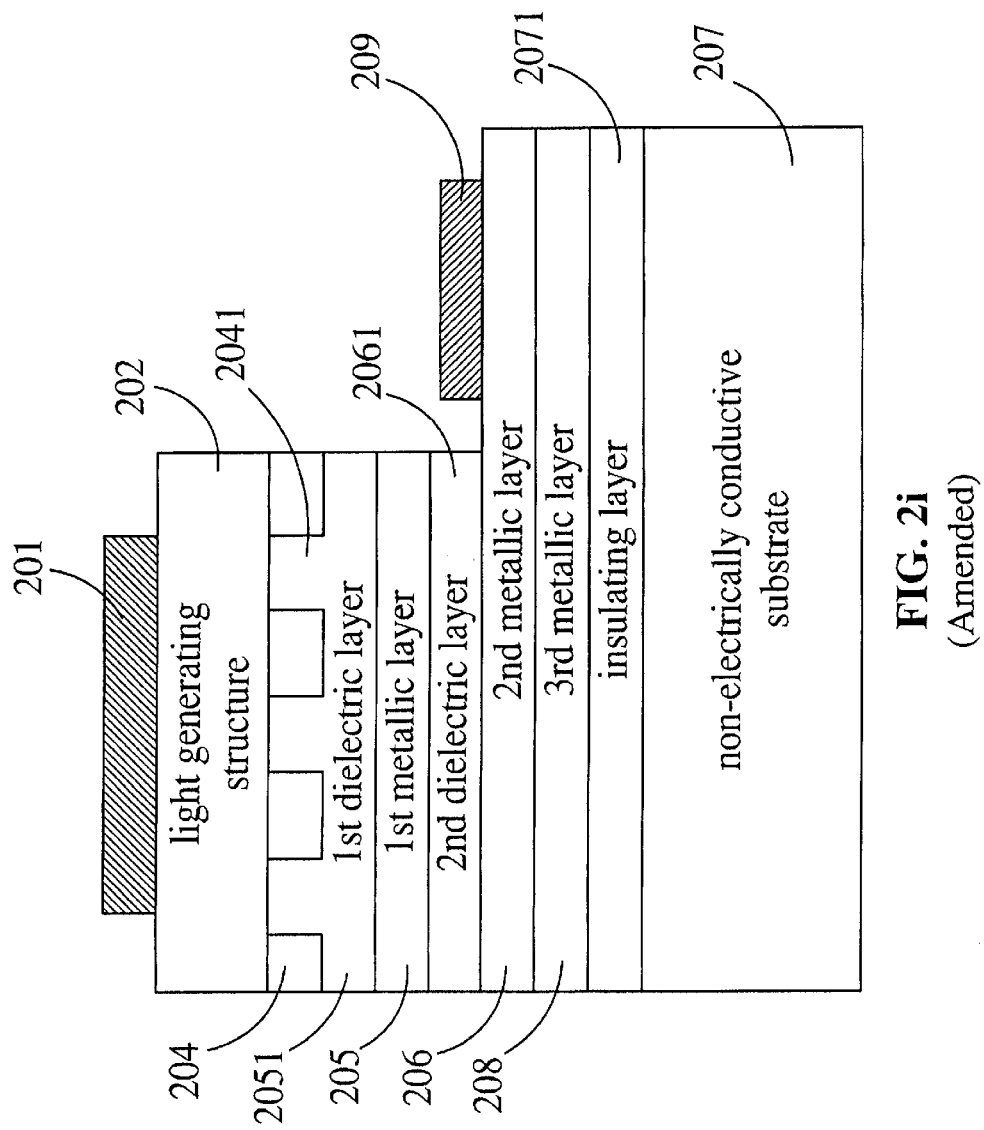
FIG. 2i
(Amended)

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

THE DRAWING FIGURES HAVE BEEN CHANGED AS FOLLOWS:

FIG. 2i is corrected to be consistent with specification at col. 6, lines 47-58 to make second electrode 209 in contact with second metallic layer 20b.

AS A RESULT OF REEXAMINATION, IT HAS BEEN DETERMINED THAT:

Claims 1, 4, 19, and 20 are determined to be patentable as amended.

Claims 2, 3 and 5-18, dependent on an amended claim, are determined to be patentable.

New claims 21-32 are added and determined to be patentable.

1. A light emitting diode structure having a plurality of layers positioned sequentially from bottom to top, comprising:
   a substrate;
   a first metallic layer made of one of a pure metal and a metal nitride above said substrate;
   *an optically transparent and electrically conductive first dielectric layer;*
   a non-alloy ohmic contact layer made of a carbon-doped semiconductor above [said first metallic layer] *said optically transparent and electrically conductive first dielectric layer wherein no metal layer is positioned between said non-alloy ohmic contact layer and said first metallic layer*; and
   a light generating structure above said non-alloy ohmic contact layer which generates lights in response to the conduction of current through said light emitting diode structure.

4. The light emitting diode structure as claimed in claim [3] *1*, wherein said first dielectric layer is made of a transparent conductive oxide.

19. [The] *A* light emitting diode structure [as claimed in claim 1, wherein said substrate is a non-electrically conductive substrate] *having a plurality of layers positioned sequentially from bottom to top, comprising:*
   *a non-electrically conductive substrate;*
   *a first metallic layer made of one of a pure metal and a metal nitride above said substrate;*
   *a non-alloy ohmic contact layer made of a carbon-doped semiconductor above said first metallic layer; and*
   *a light generating structure above said non-alloy ohmic contact layer which generates lights in response to the conduction of current through said light emitting diode structure.*

20. The light emitting diode structure as claimed in claim 19, wherein said *non-electrically conductive* substrate is made of one of the following materials: Ge, Si, GaAs, GaP, InP, InAs, GaN, AlN, AlGaAs, SiC, GaAsP, sapphire, glass, quartz, and ceramic.

*21. A light emitting diode structure having a plurality of layers positioned sequentially from bottom to top, comprising:*
   *a substrate;*
   *an insulating layer immediately on top of said substrate for a planar arrangement of electrodes of said light emitting diode structure;*
   *a first metallic layer made of one of a pure metal and a metal nitride above said substrate;*
   *a non-alloy ohmic contact layer made of a carbon-doped semiconductor above said first metallic layer; and*
   *a light generating structure above said non-alloy ohmic contact layer which generates lights in response to the conduction of current through said light emitting diode structure.*

*22. A light emitting diode structure having a plurality of layers positioned sequentially from bottom to top, comprising:*
   *a substrate;*
   *a first metallic layer made of one of a pure metal and a metal nitride above said substrate;*
   *an optically transparent and electrically conductive first dielectric layer;*
   *a non-alloy ohmic contact layer made of a carbon-doped semiconductor above said optically transparent and electrically conductive first dielectric layer wherein said optically transparent and electrically conductive first dielectric layer is the only layer between said non-alloy ohmic contact layer and said first metallic layer; and*
   *a light generating structure above said non-alloy ohmic contact layer which generates lights in response to the conduction of current through said light emitting diode structure.*

*23. The light emitting diode structure as claimed in claim 21, wherein said insulating layer is made of one of the following materials: $SiN_x$ and $SiO_x$.*

*24. The light emitting diode structure as claimed in claim 1, wherein said non-alloy ohmic contact layer has a doping density at least $1E19/cm^{-3}$.*

*25. The light emitting diode structure as claimed in claim 21, wherein said non-alloy ohmic contact layer has a doping density at least $1E19/cm^{-3}$.*

*26. The light emitting diode structure as claimed in claim 22, wherein said non-alloy ohmic contact layer has a doping density at least $1E19/cm^{-3}$.*

*27. The light emitting diode structure as claimed in claim 1, further comprising a first electrode above said light generating structure and a second electrode below said substrate.*

*28. The light emitting diode structure as claimed in claim 22, further comprising a first electrode above said light generating structure and a second electrode below said substrate.*

*29. A light emitting diode structure having a plurality of layers, comprising:*
   *a substrate;*
   *a first metallic layer made of one of a pure metal and a metal nitride above said substrate;*
   *an optically transparent and electrically conductive first dielectric layer on said first metallic layer;* a non-alloy ohmic contact layer made of a carbon-doped semiconductor coated directly on said first dielectric layer and wherein no metal-containing grid or channels are provided within the non-alloy ohmic contact and first dielectric layers; and a light generating structure above said non-alloy ohmic contact layer which generates lights in response to the conduction of current through said light emitting diode structure.

30. A light emitting diode structure having a plurality of layers positioned sequentially from bottom to top, comprising:

a substrate;

a first metallic layer made of one of a pure metal and a metal nitride above said substrate;

a non-alloy ohmic contact layer made of a carbon-doped semiconductor above said first metallic layer;

an optically transparent and electrically conductive first dielectric layer positioned between said first metallic layer and said non-alloy ohmic contact layer, wherein no metal layer is positioned between said non-alloy ohmic contact layer and said first dielectric layer; and a light generating structure above said non-alloy ohmic contact layer which generates lights in response to the conduction of current through said light emitting diode structure.

31. The light emitting diode structure as claimed in claim 30, wherein said non-alloy ohmic contact layer has a doping density at least 1E19/cm−3.

32. The light emitting diode structure as claimed in claim 30, further comprising a first electrode above said light generating structure and a second electrode below said substrate.

* * * * *